(12) United States Patent
Darmawaskita et al.

(10) Patent No.: US 9,312,844 B2
(45) Date of Patent: Apr. 12, 2016

(54) SLOPE COMPENSATION MODULE

(71) Applicant: Microchip Technology Incorporated, Chandler, AZ (US)

(72) Inventors: Hartono Darmawaskita, Chandler, AZ (US); Sean Stacy Steedman, Phoenix, AZ (US); Cristian Nicolae Groza, Pascani (RO); Marilena Mancioiu, Corabia (RO); John Robert Charais, Phoenix, AZ (US); Zeke Lundstrum, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 95 days.

(21) Appl. No.: 14/080,151

(22) Filed: Nov. 14, 2013

(65) Prior Publication Data

US 2014/0132236 A1   May 15, 2014

Related U.S. Application Data

(60) Provisional application No. 61/726,977, filed on Nov. 15, 2012.

(51) Int. Cl.
*H02M 3/157* (2006.01)
*H03K 7/08* (2006.01)
(Continued)

(52) U.S. Cl.
CPC .............. *H03K 7/08* (2013.01); *H02M 3/156* (2013.01); *H03K 4/502* (2013.01); *H03K 6/04* (2013.01)

(58) Field of Classification Search
CPC ... H02M 3/156; H02M 3/157; H02M 3/1588; H02M 2001/0012; Y02B 70/1466
See application file for complete search history.

(56) References Cited

U.S. PATENT DOCUMENTS 5,903,452 A * 5/1999 Yang ................. H02M 3/33507
                                                          363/131
5,905,370 A * 5/1999 Bryson ......................... 323/283
(Continued)

FOREIGN PATENT DOCUMENTS

GB           2045566 A    10/1980   ............ H03K 3/353

OTHER PUBLICATIONS

International Search Report and Written Opinion, Application No. PCT/US2013/070244, 16 pages, May 13, 2014.
(Continued)

*Primary Examiner* — Emily P Pham
(74) *Attorney, Agent, or Firm* — Slayden Grubert Beard PLLC

(57) ABSTRACT

A slope compensation module provides slope compensation of a switched-mode power supply using current mode control. The slope control unit comprises a capacitor coupled between an input and an output of the slope control unit, a switch for discharging the capacitor and a constant current source for charging the capacitor. Slope compensation parameters may be changed during operation with a programmable constant current source. The slope compensation module may also function as an analog sawtooth waveform frequency generator, and as an analog pulse width modulation (PWM) generator. Charging the capacitor generates a linearly decreasing (negative slope) ramp voltage for modulating a feedback error voltage into a slope compensated feedback error voltage. Capacitor charging may be controlled from a pulse width modulation signal. Opening of the switch may be programmably delayed, and a minimum closed time thereof may also be programmed during operation of the slope compensation module.

34 Claims, 11 Drawing Sheets

(51) Int. Cl.
*H03K 6/04* (2006.01)
*H02M 3/156* (2006.01)
*H03K 4/502* (2006.01)

(56) References Cited

U.S. PATENT DOCUMENTS

| | | | |
|---|---|---|---|
| 6,188,261 B1* | 2/2001 | Nosaka et al. | 327/261 |
| 6,252,311 B1* | 6/2001 | West | 307/29 |
| 7,541,795 B1* | 6/2009 | Smith et al. | 323/285 |
| 2003/0042865 A1* | 3/2003 | Mayhew et al. | 318/727 |
| 2005/0270003 A1* | 12/2005 | Floyd et al. | 323/282 |
| 2006/0050539 A1* | 3/2006 | Yang et al. | 363/21.16 |
| 2006/0103332 A1* | 5/2006 | Motomori et al. | 315/308 |
| 2006/0202669 A1* | 9/2006 | Nishimori | 323/283 |
| 2008/0150508 A1* | 6/2008 | Sohma | 323/283 |
| 2009/0080227 A1* | 3/2009 | Nakahashi | 363/80 |
| 2014/0049239 A1* | 2/2014 | Labbe | 323/282 |

OTHER PUBLICATIONS

Partial International Search Report, Application No. PCT/US2013/070244, 2 pages, Feb. 24, 2014.

* cited by examiner

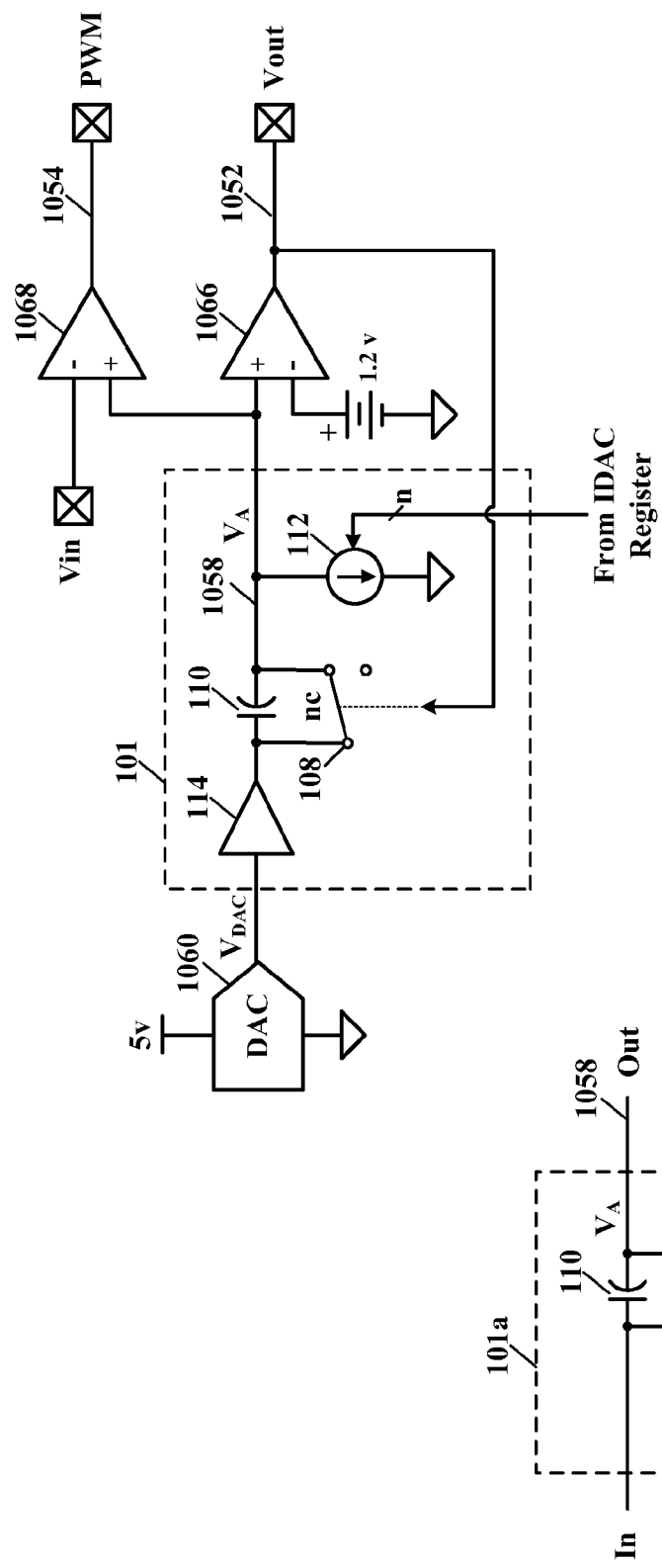
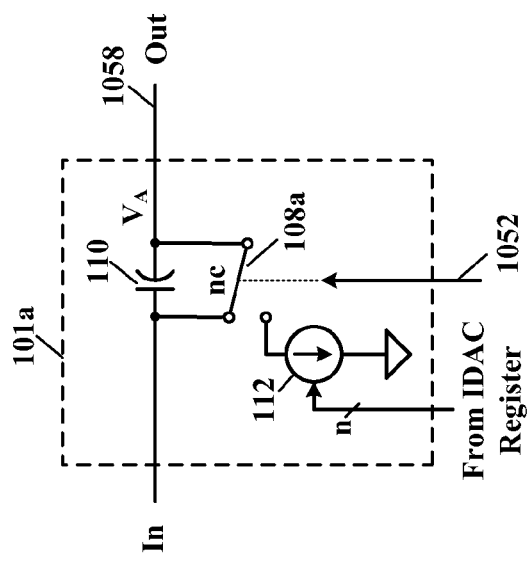
FIGURE 10
FIGURE 10A

SLOPE COMPENSATION MODULE

RELATED PATENT APPLICATION

This application claims priority to commonly owned U.S. Provisional Patent Application Ser. No. 61/726,977; filed Nov. 15, 2012; entitled "Slope Compensation Module," by Hartono Darmawaskita, Sean Stacy Steedman, Cristian Nicolae Groza, Marilena Mancioiu, John Robert Charais and Zeke Lundstrum; and is hereby incorporated by reference herein for all purposes.

TECHNICAL FIELD

The present disclosure relates to a slope compensation module, and in particular, a slope compensation module for use in a microcontroller in combination with other modules such as, for example but not limited to, comparator and operational amplifiers, etc., to control switched-mode power supply circuitry and similar applications.

BACKGROUND

There exists a need for a microcontroller having circuitry for a real-time analog closed loop system and other applications such as frequency generator and/or pulse width modulators. In conventional switched-mode power supply embodiments, a user must provide external components such as resistor(s) and/or capacitor(s) to set the slope value in the switched-mode power supply application, hence the selection is fixed. In other words, it can not be adjusted or changed without physically changing component on the printed circuit board. In particular, there exists a need for a slope compensation module for use in a microcontroller, in particular when combined with other peripheral devices and external devices to form a microcontroller controlled switched-mode power supply or other application.

A common switched-mode power supply (SMPS) control methodology is called "peak current mode control" (PCMC). In PCMC the SMPS power inductor current is monitored with an analog comparator. The comparator threshold sets the peak current limit. The peak current is related to the average current (with some assumptions). The ratio between average current and the peak current can change when the user's PWM duty cycle is greater than fifty percent. Duty cycles greater than fifty percent have problems with sub-cycle oscillations. Stopping these oscillations requires the addition of "slope compensation" which decreases the peak current limit as the PWM duty cycle increases. The reduction in peak currents is designed to maintain the same average currents with increasing PWM duty cycles. With duty cycles greater than fifty percent, the inductor current may not return to zero by the start of the next cycle. To prevent this instability, conventional analog PWM controllers use slope compensation to modulate a downward slope onto the current reference value to stabilize the power circuit. However selection of component values for proper slope compensation can only be optimized for a very narrow and specific range of SMPS operating conditions

SUMMARY

Therefore, a need exists for an enhanced slope compensation module that may be used over a wide operating range PMW duty cycles and in combination with a microcontroller for SMPS applications, etc.

According to an embodiment, a slope compensation module for use with current mode control in a switched-mode power supply (SMPS) controller, said slope compensation module may comprise: a slope compensation capacitor coupled between an input and an output; a slope compensation switch coupled in parallel with the slope compensation capacitor; and a constant current source coupled to the output side of the slope compensation capacitor and to the slope compensation switch; wherein when the slope compensation switch may be open the slope compensation capacitor charges through the constant current source to a circuit common and thereby generates a linearly decreasing (negative slope) ramp voltage.

According to a further embodiment, when the slope compensation switch is closed the slope compensation capacitor may discharge. According to a further embodiment, the constant current source may be decoupled from the output side of the slope compensation capacitor when the slope compensation switch may be in a first position, and may be coupled to the output side of the slope compensation capacitor when the slope compensation switch may be in a second position. According to a further embodiment, the linearly decreasing (negative slope) ramp voltage may be adapted to automatically adjust a feedback loop error voltage. According to a further embodiment, the constant current source may comprise a programmable constant current source having a plurality of selectable constant current values. According to a further embodiment, the slope compensation capacitor may comprise a plurality of slope compensation capacitors programmably selectable for a desired capacitance value.

According to another embodiment, a switched-mode power supply (SMPS) controller having a slope compensation module may comprise: a voltage reference; an operational amplifier having a first input coupled to the voltage reference and a second input adapted for coupling to an output voltage from a SMPS filter capacitor; a slope compensation module having an input coupled to an output of the operational amplifier, and an output, wherein the slope compensation module may comprise a slope compensation capacitor coupled between the input and the output of the slope compensation module; a slope compensation switch coupled in parallel with the slope compensation capacitor; and a constant current source coupled to the output side of the slope compensation capacitor; a voltage comparator having a first input coupled to the output of the slope compensation module, and a second input adapted for coupling to a current-to-voltage circuit that measures a current signal; a period generator; and a reset dominant latch may comprise a set input coupled to an output of the period generator, a reset input coupled to an output of the voltage comparator, and an output that may be coupled to and controls opening and closing the slope compensation switch, the output of the reset dominant latch may also provide a control signal; the period generator may provide a plurality of pulses at a pulse period to the set input of the reset dominant latch, wherein each time a pulse may be received at the set input of the reset dominant latch the output thereof may go to a second logic level from a first logic level; when the output of the reset dominant latch may be at the second logic level the slope compensation switch may open and the slope compensation capacitor may charge through the constant current source to a circuit common, thereby generating a linearly decreasing (negative slope) ramp voltage for modulating a feedback error voltage from the operational amplifier into a slope compensated feedback error voltage; when the slope compensated feedback error voltage that may be coupled to the first input of the voltage comparator may be less than a voltage representing the current through the SMPS inductor at the second input of the voltage comparator, the output of the reset dominant latch may return to the first logic level and the slope compensation switch may close thereby discharging the slope compensation capacitor and returning the first input of the voltage comparator to the feedback error voltage from the operational amplifier.

According to a further embodiment, the constant current source may be a programmable constant current source having a plurality of selectable constant current values. According to a further embodiment, a buffer amplifier may be coupled between the output of the operational amplifier and the slope compensation capacitor and switch. According to a further embodiment, a loop compensation network may be coupled between the output and the second input of the operational amplifier. According to a further embodiment, the voltage representing the current through the SMPS inductor may be generated with a current-to-voltage sensor. According to a further embodiment, the current-to-voltage sensor may comprise a current transformer in a current path of the SMPS inductor, a rectifier diode coupled to the current transformer and a load resistor coupled to the resistor. According to a further embodiment, the current-to-voltage sensor may comprise a resistor in a current path of the SMPS inductor and a diode coupled to the resistor. According to a further embodiment, the period generator may be programmable for selecting one of a plurality pulse period times.

According to a further embodiment, the slope compensation switch may be a metal oxide semiconductor field effect transistor (MOSFET). According to a further embodiment, a slope compensation switch controller may be coupled between the output of the reset dominant latch and the slope compensation switch, wherein the slope compensation switch controller may provide programmable opening delay for the slope compensation switch. According to a further embodiment, the slope compensation switch controller may provide programmable minimum closed time for the slope compensation switch. According to a further embodiment, the output voltage from the SMPS filter capacitor may be provided through a resistive voltage divider. According to a further embodiment, the constant current source may be adapted for calibration during testing of the SMPS controller. According to a further embodiment, the slope compensation capacitor may be a plurality of slope compensation capacitors programmably selectable for a desired capacitance value. According to a further embodiment, the slope compensation capacitor may be a plurality of slope compensation capacitors programmably selectable for a desired capacitance value during testing of the SMPS controller.

According to a further embodiment, a digital processor may be coupled to the constant current source that may be programmable and the period generator that may be programmable, wherein the digital processor may provide constant current values and pulse period times, respectively, thereto. According to a further embodiment, the SMPS controller may comprise a microcontroller. According to a further embodiment, the constant current source may be coupled to the output side of the slope compensation capacitor with the slope compensation switch. According to a further embodiment, the constant current source may be decoupled from the output side of the slope compensation capacitor when the slope compensation switch may be in a first position, and coupled to the output side of the slope compensation capacitor when the slope compensation switch may be in a second position.

According to yet another embodiment, an analog pulse width modulation (PWM) generator may comprise: a capacitor having an input coupled to a first voltage reference; a switch coupled in parallel with the input and an output of the capacitor; a constant current source coupled to the output of the capacitor; a first voltage comparator having a first input coupled to the output of the capacitor, a second input coupled to a second voltage reference and an output that controls opening and closing of the switch; a second voltage comparator having a first input coupled to the output of the capacitor, a second input adapted for coupling to a voltage from a switched-mode power supply (SMPS) and an output that provides a pulse width modulated (PWM) control signal for controlling a power switch of a switched-mode power supply; wherein when a voltage at the output of the capacitor may be less than a voltage from the first voltage reference the switch may open, whereby the capacitor and the constant current source may modulate a voltage from the first voltage reference with a linear negatively sloping voltage waveform; wherein a voltage difference between the first and second voltage references may determine a period of the PWM control signal, and a voltage difference between the voltage from the SMPS and the voltage at the second node of the capacitor may determine a duty cycle of the PWM control signal.

According to a further embodiment, the constant current source may be a programmable constant current source having a plurality of selectable constant current values. According to a further embodiment, the capacitor may be a plurality of capacitors programmably selectable for a desired capacitance value. According to a further embodiment, the first voltage reference may be a digital-to-analog converter (DAC) and may provide programmable first reference voltage values. According to a further embodiment, the first voltage reference may be fixed. According to a further embodiment, the first voltage reference may be a modulated waveform signal. According to a further embodiment, a buffer amplifier may be coupled between the output of the first voltage reference and the input of the capacitor. According to a further embodiment, the constant current source may be decoupled from the output of the capacitor when the switch may be in a first position, and coupled to the output of the capacitor when the switch may be in a second position.

According to still another embodiment, a method for providing slope compensation in a switched-mode power supply (SMPS) controller may comprise the steps of: providing a reference voltage; comparing the reference voltage to an output voltage from a SMPS filter network with an operational amplifier having an output that may provide a error voltage that may be the difference between the reference voltage and the voltage from the SMPS filter capacitor; providing a slope compensation capacitor coupled to the output of the operational amplifier; providing a slope compensation switch coupled in parallel with the slope compensation capacitor; providing a constant current source coupled to the slope compensation capacitor and to the slope compensation switch; comparing a slope compensated error voltage from the slope compensation capacitor to a voltage representation of current measured in a SMPS inductor; providing a reset dominant latch having a set input coupled to an output of the period generator, a reset input coupled to an output of the voltage comparator, and an output that may control opening and closing of the slope compensation switch and for supplying a control signal; and providing a plurality of pulses at a pulse period from a period generator to the set input of the reset dominant latch, wherein each time a pulse may be received at the set input of the reset dominant latch the output thereof may go to a second logic level from a first logic level; opening the slope compensation switch when the output of the reset dominant latch may be at the second logic level; generating a linearly decreasing (negative slope) ramp voltage for modulating the feedback error voltage from the operational amplifier into a slope compensated feedback error voltage; and returning the output of the reset dominant latch to the first logic level and closing the slope compensation switch when the slope compensated error voltage may be less than the voltage representing the current through the SMPS inductor.

BRIEF DESCRIPTION OF THE DRAWINGS

A more complete understanding of the present disclosure may be acquired by referring to the following description taken in conjunction with the accompanying drawings wherein:

FIG. 10 illustrates a schematic block diagram of an analog saw-tooth and pulse width modulation generator using a slope compensation module, according to yet another specific example embodiment of this disclosure;

FIG. 10A illustrates a schematic diagram of a slope compensation module that may be alternatively used in all of the embodiments of this disclosure;

Figure 1:
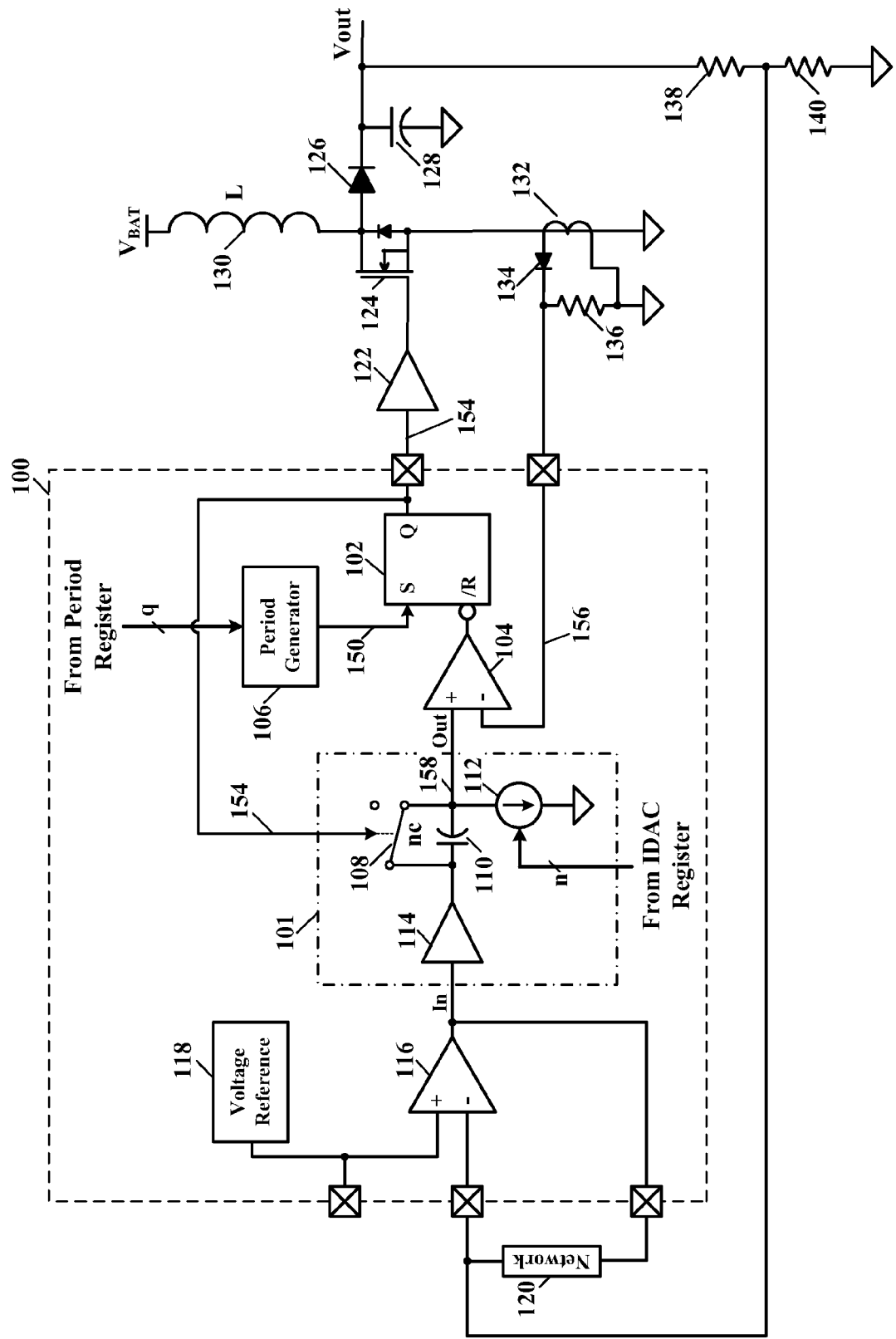
FIG. 1 illustrates a schematic block diagram of a boost switched-mode power converter with slope compensation, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, slope compensation expands the capabilities of microcontrollers, in particular for use in switched-mode power supply (SMPS) and other power control applications. For example, the functionality of many switched-mode power supply (SMPS) applications may be improved by having the capability of slope compensation. For example when a SMPS application has duty cycles greater than fifty (50) percent that would otherwise lead to instability of the SMPS system. According to various embodiments, such a slope compensation module may be programmably combined within the microcontroller integrated circuit along with other modules, for example but not limited to a comparator as well as other internal and external analog and/or digital devices.

Slope compensation implementation as a microcontroller peripheral allows configurability, setting slope value by writing to a register(s) in the microcontroller memory map, allowing the power supply application to be dynamically adaptable or configurable on the fly by using a microcontroller, according to various embodiments disclosed herein. The entire slope compensation function may be self-contained without the need of external components. This enhanced functionality may be applied to a microcontroller controlled SMPS, for example but is not limited to, a boost or buck converter type SMPS.

According to various embodiments, the slope compensation module in combination with comparator(s) devices may function as an analog sawtooth waveform frequency generator, and as an analog pulse width modulation (PWM) generator. In the PWM generator application, the slope compensation module may be used with a voltage reference and a digital-to-analog converter (DAC), both integral with the microcontroller and/or other peripherals of the microcontroller. Fast and flexible slope value selection by the microcontroller may provide for a very large variety of waveform amplitudes and frequencies, and hence the slope compensation module may be used as a configurable analog PWM generator.

The slope compensation module may include calibration capabilities that, for example, may be invoked during product test in manufacturing. While the silicon process may result in large variations of a current source and capacitor that may be used for the slope compensation module circuit, calibration allows compensation adjustments of the fabrication variations, thus resulting in a microcontroller based product that has an accurate slope parameter(s) that may be relied upon when doing power system designs.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of boost switched-mode power converter with slope compensation, according to a specific example embodiment of this disclosure. The switched-mode power converter may comprise a power inductor 130, a power switching transistor 124, a driver transistor 122, a power rectifier 126, a filter capacitor 128, a current-to-voltage circuit comprising a current sensor 132, a rectifier 134 and a load resistor 136; voltage divider resistors 138 and 140, voltage error loop compensation network 120, and a mixed signal integrated circuit 100. The current-to-voltage circuit that measures the current through the inductor 130 may also comprise a resistor 332 in the source lead of the power switching transistor 124 (FIG. 3), a resistor-capacitor network across the inductor 130, etc.

The mixed signal integrated circuit 100, e.g., microcontroller, may comprise a reset dominant SR-Latch 102, a voltage comparator 104, a period generator 106, an operational amplifier 116, a voltage reference 118, and a slope compensation module 101. The slope compensation module 101 may comprise a slope compensation switch 108, a slope compensation capacitor 110, a constant current digital-to-analog converter (IDAC) 112, and, optionally, a buffer amplifier 114. The IDAC 112 may have a programmable range of current values. The slope compensation capacitor 110 may have a programmable range of capacitance values. The slope compensation switch 108 may be a semiconductor device adapted for operating over a range of voltages, e.g., a metal oxide semiconductor field effect transistor (MOSFET). The period generator 106 may have a programmable range of frequencies (periods) that it may generate. The mixed signal integrated circuit 100 may further comprise a digital processor with memory 1262 (FIG. 12) that may provide period and current values to the period generator 106 and the IDAC 112, respectively.

The operational amplifier 116, e.g., an operational amplifier, provides an error voltage at its output that is the difference between a reference voltage from the voltage reference 118 and an output voltage, Vout, divided by the voltage divider resistors 138 and 140. This error voltage may be buffered by the buffer amplifier 114 if the operational amplifier 116 does not have enough drive capability to drive the constant current source IDAC 112 directly. An alternative slope compensation module 101a may be used instead, see FIG. 10A. When the slope compensation switch 108 is closed (normally closed) the slope compensation capacitor 110 is effectively shorted out and discharged, and both sides of the capacitance plates of the capacitor 110 are at the error voltage, e.g., the capacitor 110 does not affect circuit operation between the output of the operational amplifier 116 and the positive input of the voltage comparator 104.

The voltage comparator 104 receives the output from the slope compensation module 101 and compares it to a voltage representative of the inductor 130 current from the current-to-voltage sensing circuit (current sensor 132, rectifier 134 and load resistor 136). When the voltage at the positive input of the voltage comparator 104 is equal to or greater than the voltage at the negative input, representing the inductor 130 current, the output of the voltage comparator 104 is at a logic high. When the voltage at the positive input is less than the voltage at the negative input, the output of the voltage comparator 104 is at a logic low. The output of the voltage comparator 104 is coupled to the /reset input of the reset dominant SR-Latch 102, and an output of the period generator 106 is coupled to the set input of the reset dominant SR-Latch 102. When the set input of the reset dominant SR-Latch 102 is at a logic high the Q output thereof will go to a logic high. When the /reset input of the reset dominant SR-Latch 102 is at a logic low the Q output thereof will go to a logic low.

Figure 2:
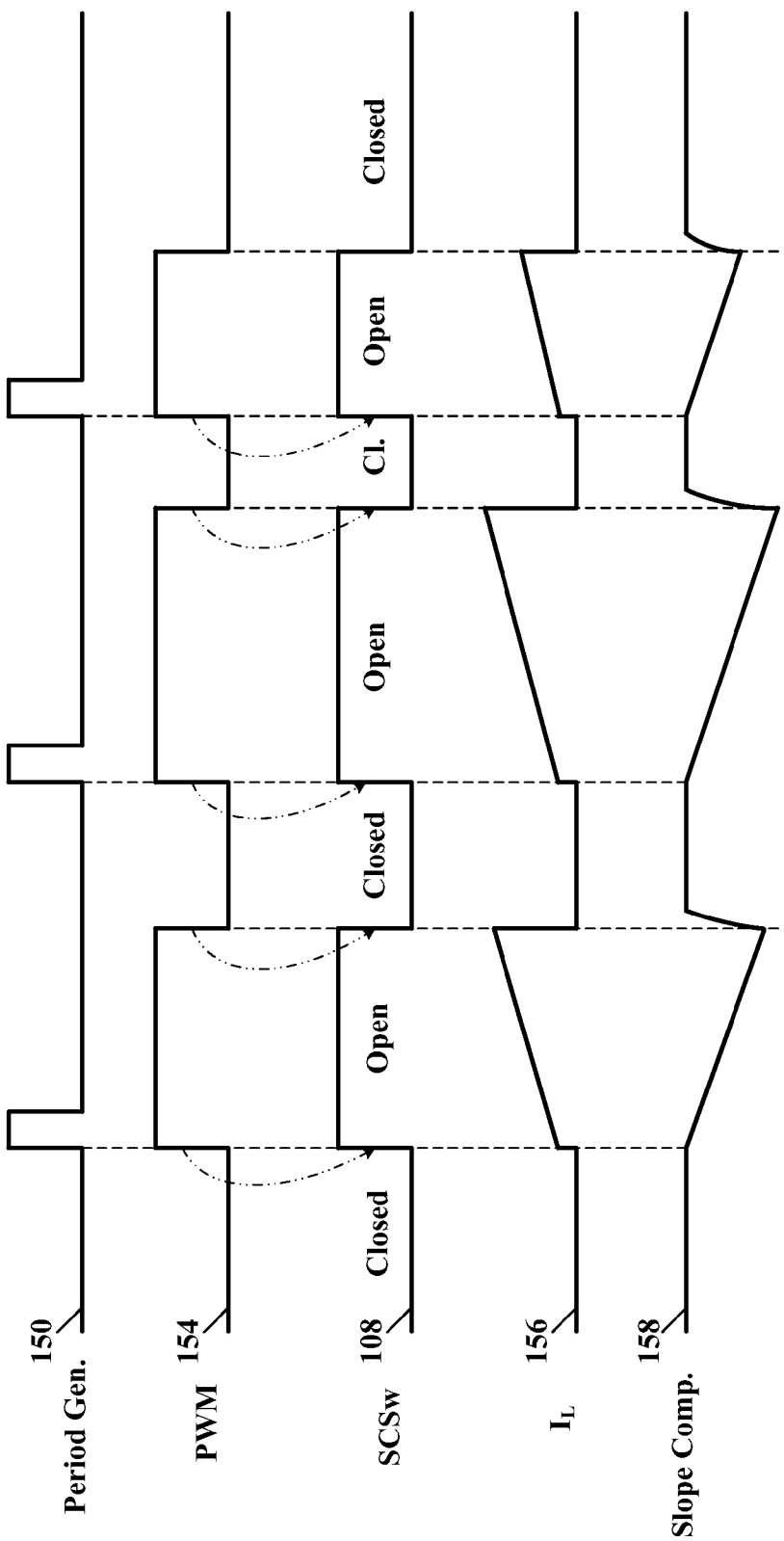
FIG. 2 illustrates schematic waveform timing diagrams of the boost switched-mode converter with slope compensation, according to the specific example embodiment shown in FIG. 1.

Referring to FIG. 2, depicted are schematic waveform timing diagrams of the boost switched-mode converter with slope compensation, according to the specific example embodiment shown in FIG. 1. When there is a logic low to logic high transition at the output of the period generator (shown in FIG. 2 as waveform signal 150) the Q-output of the reset dominant SR-Latch 102 will go to a logic high which starts a pulse width modulation (PWM) period represented as PWM signal 154. When the output of the voltage comparator 104 goes to a logic low the Q-output of the reset dominant SR-Latch 102 goes back to a logic low, thereby determining the PWM signal 154 on (logic high) duration, e.g., pulse width or "duty cycle." The PWM signal 154 may control the turn on and turn off of the power switching transistor 124.

When the PWM duty cycle for example becomes greater than fifty percent, the instantaneous current in the inductor 130 may become disproportionately large compared to the desired inductor 130 average current, $I_L$. This may create instability in the SMPS control loop(s) and undesirable sub-harmonic oscillations. Loop instability and sub-harmonic oscillations have been effectively prevented in peak current mode control switched-mode power supply designs by modulating the voltage feedback error voltage 158 with a negative sloped waveform. This negative sloped waveform has been implemented in prior technology SMPS designs with a circuit that requires external components. This analog external component design only effectively works for a narrow range of operating conditions of the SMPS system and must be specifically implemented for each application.

According to the teachings of this disclosure, a switched (switch 108) slope compensation capacitor 110 in combination with a constant current source IDAC 112, may be effectively used to modulate the voltage feedback error voltage 158 with a linearly decreasing (negative slope) ramp voltage for proper slope compensation of the SMPS. When the slope compensation switch 108 opens the slope compensation capacitor 110 is initially discharged and has both plates (sides) of the capacitor 110 at the same voltage potential, e.g., the error voltage from the output of the operational amplifier 116. But now the plate of the capacitor 110 connected to the constant current source IDAC 112 will begin to charge to common (e.g., ground or Vss) through the IDAC 112, thereby dropping the voltage at the positive input of the voltage comparator 104 as a linearly decreasing (negative slope) ramp voltage. By properly selecting the capacitance value of the slope compensation capacitor 110 and the constant current value for the IDAC 112, a wide operating range of slope compensation for the SMPS may be provided in a simple integrated solution without requiring external components.

The voltage control loop "sees" a very slow moving average voltage value change in Vout because of the long time constant caused by the large capacitance value filter capacitor 128. However, the inductor 130 current 156, $I_L$, changes rapidly within each PWM pulse period (when the power transistor 124 is on). When the duty cycle of the PWM signal 154 becomes greater than fifty (50) percent the rapidly changing inductor current 156 may cause current loop control instability of the SMPS. Correction of this instability problem is simple, use slope compensation to negative slope modulate the error voltage 158 so that the PWM pulse is terminated (power transistor 124 off) before current loop instability can occur. Slope compensation is shown in FIG. 2 as signal waveform 158.

The slope compensation switch 108 may be controlled with the PWM signal 154, wherein when the Q-output of the reset dominant SR-Latch 102 is at a logic high, the slope compensation switch 108 is open, and when the Q-output of the reset dominant SR-Latch 102 is at a logic low, the slope compensation switch 108 is closed, thereby discharging the slope compensation capacitor 110 and effectively removing it from the error voltage feedback loop. By selecting a specific constant current value in combination with the capacitance value of the capacitor 110, an optimal linearly decreasing (negative slope) ramp voltage (waveform 158) may be provided. The slope of the linearly decreasing (negative slope)

ramp voltage waveform 158 (Vc) may be determined as the constant current value ($I_{DAC}$) from the IDAC 112 and by the capacitance value (C) of the capacitor 110 (change in capacitor voltage is directly related to the amount of current applied to charge the capacitor and the amount of time that the current is applied). The capacitance of the capacitor 110 may be a fixed value or it may be programmable (not shown), e.g., multiple switched capacitors. The constant current value of the IDAC 112 may be programmable and desired constant current values may be provided by an IDAC register (not shown), e.g., from a digital processor 1262 (FIG. 12) of, for example but not limited to, a microcontroller.

Figure 3:
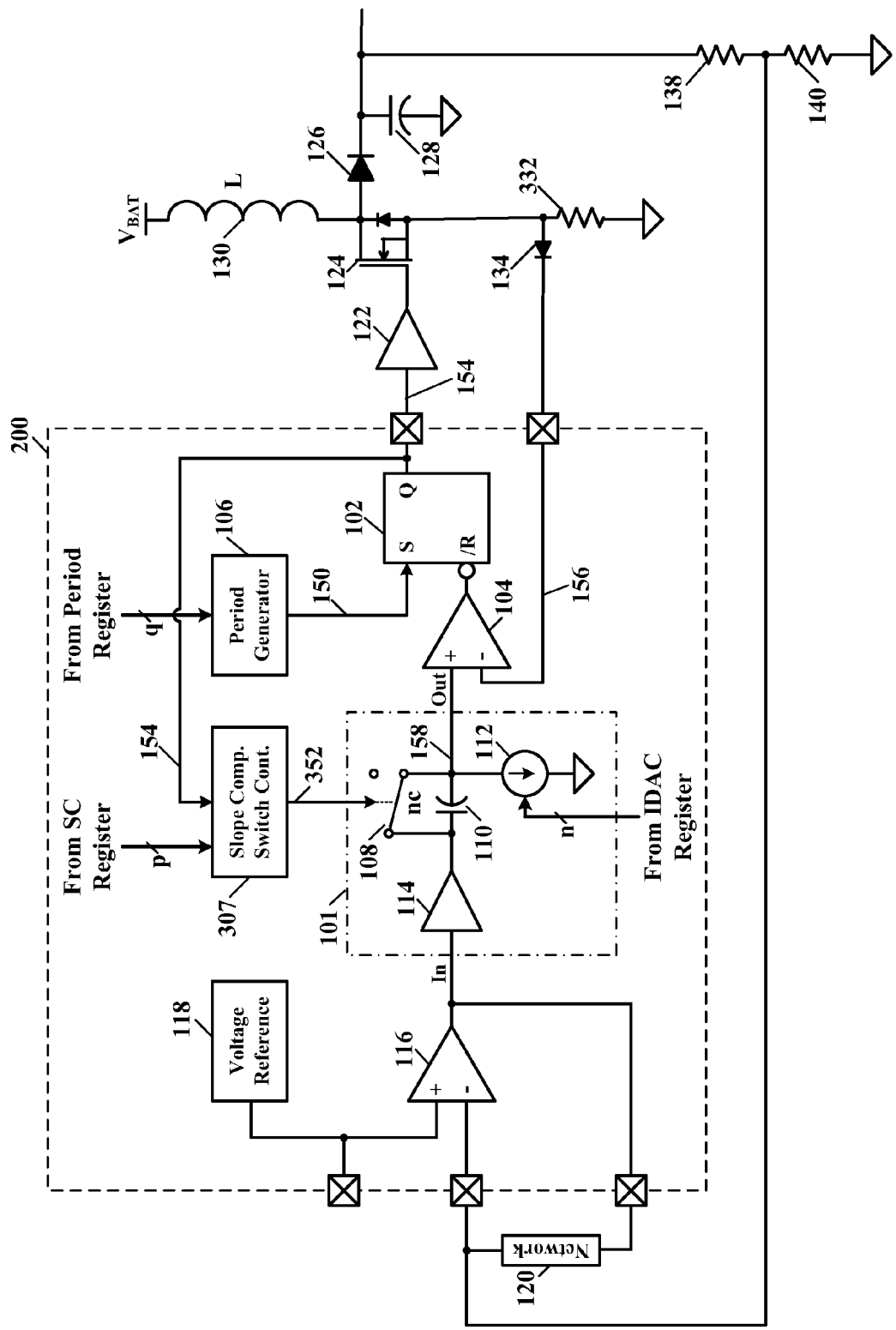
FIG. 3 illustrates a schematic block diagram of a boost switched-mode power converter with slope compensation, according to another specific example embodiment of this disclosure.

Referring to FIG. 3, depicted is a schematic block diagram of boost switched-mode power converter with slope compensation, according to another specific example embodiment of this disclosure. The switched-mode converter 200 shown in FIG. 3 works in substantially the same way as the switched-mode converter 100 shown in FIG. 1 and described hereinabove, but with the added features of programmable slope compensation start delay and forced minimum time closure of the slope compensation switch as more fully described hereinafter. The PWM signal 154 is coupled to an input of a slope compensation switch controller 307. The purpose of the slope compensation switch controller 307 is to be able to programmably delay closure of the slope compensation switch 108, and/or force the slope compensation switch 108 to remain closed for a programmable length of time, e.g., sufficient time for complete voltage discharge of the slope compensation capacitor 110, i.e., both terminals of the slope compensation capacitor 110 at substantially the same voltage potential.

Figure 4:
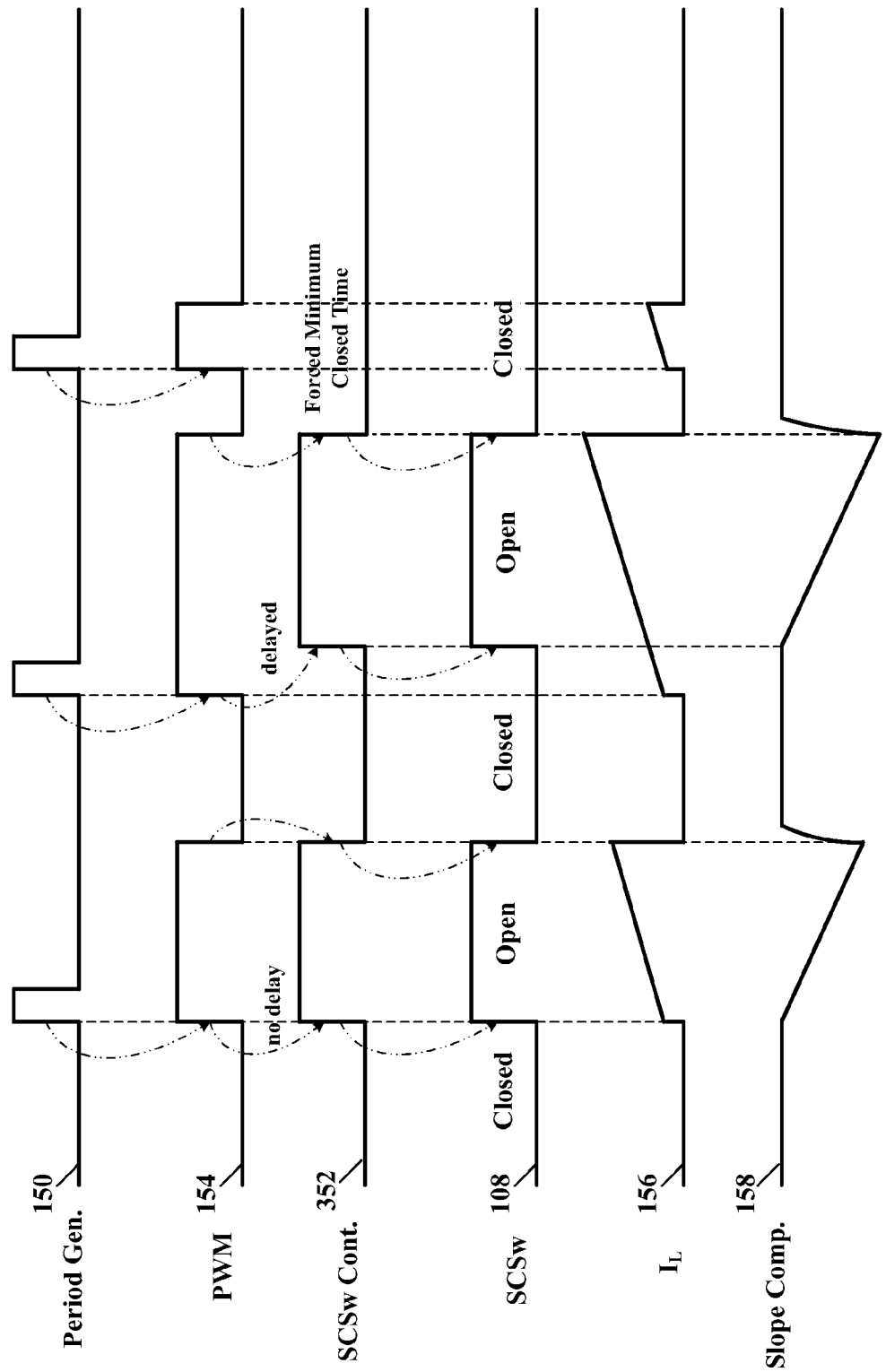
FIG. 4 illustrates schematic waveform timing diagrams of the boost switched-mode converter with slope compensation, according to the specific example embodiment shown in FIG. 3.

Referring to FIG. 4, depicted are schematic waveform timing diagrams of the boost switched-mode converter with slope compensation, according to the specific example embodiment shown in FIG. 3. Viewing left to right, in the first pulse 150 from the period generator 106, no delay is introduced to the switch control signal 352 and the slope compensation switch 108 opens and closes according to the logic levels of the PWM signal 154 (exactly the same as shown in FIG. 2). In the second pulse 150 the switch control signal 352 is delayed and the slope compensation switch 108 opens later into the PWM signal 154 pulse width. In the third pulse 150 the switch control signal 352 does not open the slope compensation switch 108 even though a PWM pulse (of short pulse width duration) has occurred. This may be because there was insufficient time to properly discharge the slope compensation capacitor 110. As shown in FIG. 4, the second PWM pulse 154 was of high pulse duration and the next (third) PWM pulse occurred shortly after the end of the second PWM pulse, thus the slope compensation switch 108 would not have remained closed for a sufficient time to properly discharge the slope compensation capacitor 110 and the third PWM pulse width was very short in duration. It is contemplated and within the scope of this disclosure that the IDAC 112 current value, the slope compensation switch 108 open delay time, and slope compensation switch 108 minimum closed time may all be programmable during operation of the switch mode converter 200 shown in FIG. 3.

Figure 5:
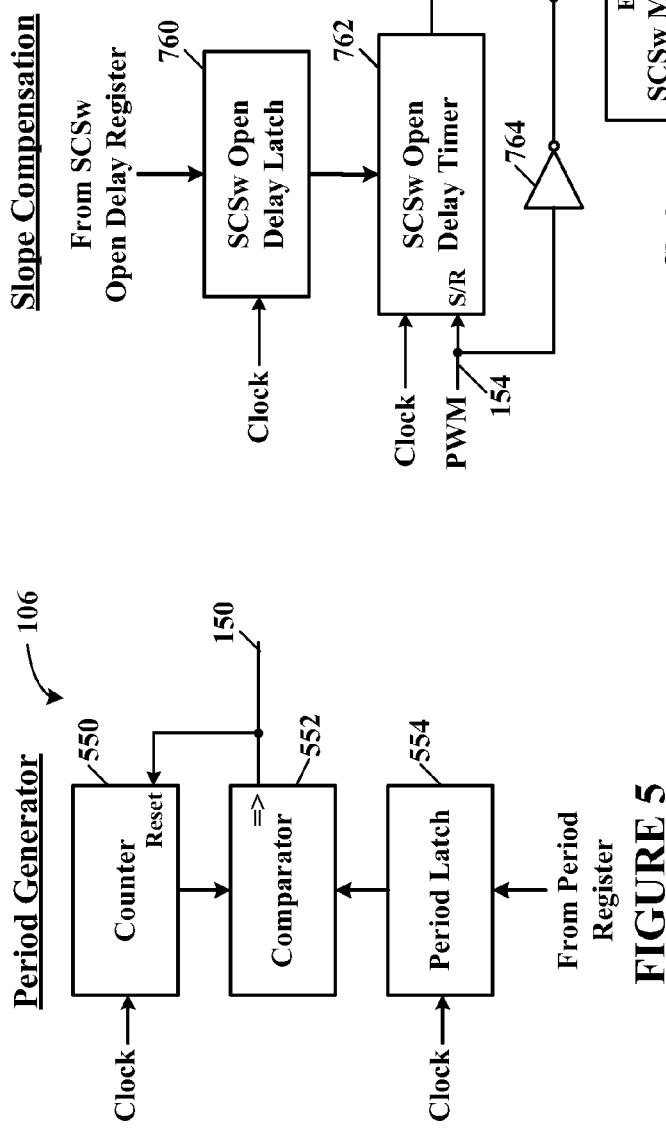
FIG. 5 illustrates a schematic block diagram of a period generator, according to the teachings of this disclosure.

Referring to FIG. 5, depicted is a schematic block diagram of a period generator, according to the teachings of this disclosure. A period generator 106 may comprise a counter 550, a comparator 552 and a period latch 554. A period value for the PWM signal 154 may be synchronously loaded into the period latch 554 from a period register (not shown) upon a clock pulse. The counter 550 continuously counts at the clock rate from zero up to the period value. Wherein the comparator 552 outputs a period pulse 150 each time the count value of the counter 550 equals the period value in the period latch 554, and also resets the counter 550 back to zero whereby the counter 550 starts counting up again. By changing the period value in the period register, the PWM period (frequency) may be changed.

Figure 6:
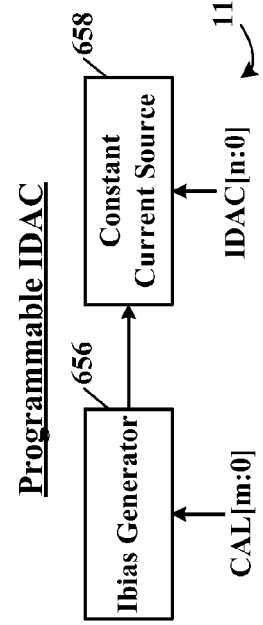
FIG. 6 illustrates a schematic block diagram of a programmable current digital-to-analog converter, according to the teachings of this disclosure.

Referring to FIG. 6, depicted is a schematic block diagram of a programmable current digital-to-analog converter, according to the teachings of this disclosure. A programmable IDAC 112 may comprise a programmable constant current source 658 and a programmable bias current generator 656 coupled to the programmable constant current source 658. Programmability of both the programmable constant current source 658 and the programmable bias current generator 656 allows calibration of the programmable IDAC 112 and changing its current source values on the fly by the digital processor 1262, e.g., during operation of the SMPS and/or slope calibration during production testing.

Figure 7:
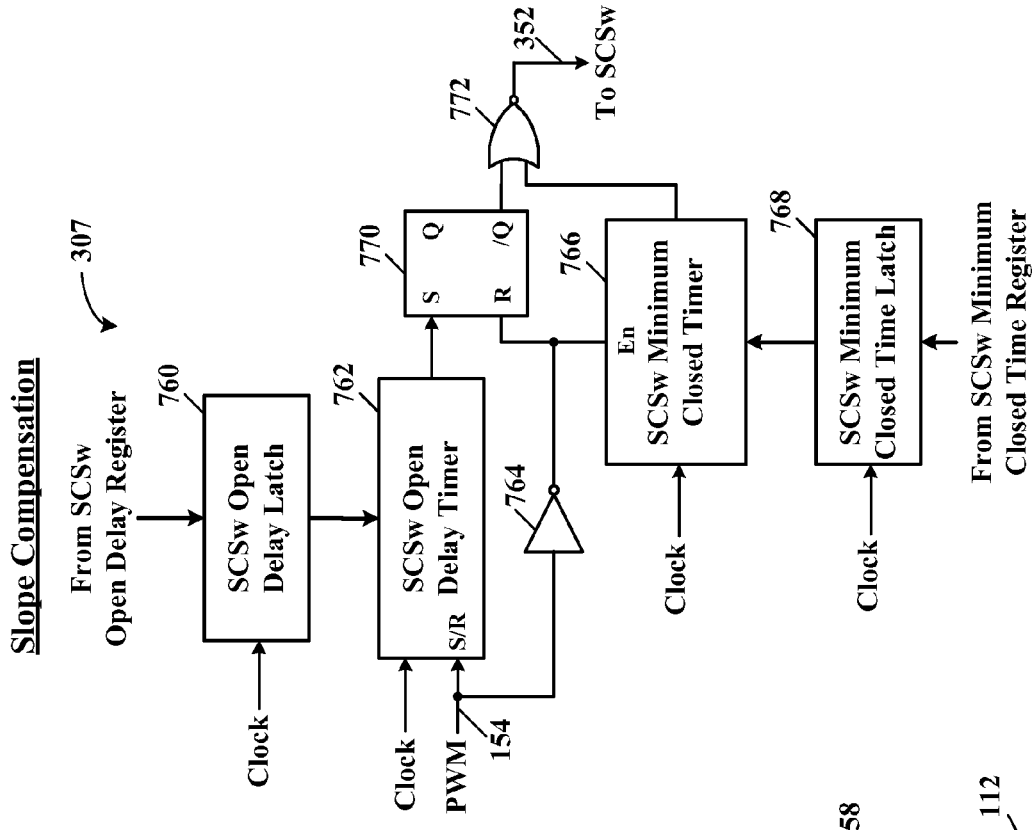
FIG. 7 illustrates a schematic block diagram of a slope compensation controller, according to specific example embodiments of this disclosure.

Referring to FIG. 7, depicted is a schematic block diagram of a slope compensation controller, according to specific example embodiments of this disclosure. The slope compensation switch controller 307 may comprise a slope compensation open delay latch 760, a slope compensation open delay timer 762, a reset dominant latch 770, an inverter 764, a NOR gate 772, a slope compensation minimum closed timer 766 and a slope compensation minimum closed latch 768, all coupled together as shown in FIG. 7. When it is desired to delay opening the slope compensation switch 108, a non-zero open time delay value may be loaded into the open delay latch 760 from an open delay latch register (not shown). The open delay timer 762 will then delay outputting a logic high to the set input of the reset dominant latch 770 according to the non-zero open time delay value. When the open delay timer 762 times out its output goes to a logic high. Wherein the /Q output of the reset dominant latch 770 goes to a logic low. When the open time delay value is zero there will be no delay in opening the switch 108. When the PWM signal 154 goes back to a logic low the open delay timer 762 will reset back to zero and the reset input of the reset dominant latch 770 will force the /Q output thereof back to a logic high.

When the PWM signal 154 goes to a logic low the minimum closed timer 766 starts timing of a minimum closed time of the slope compensation switch 108. The minimum closed time may be determined from a minimum closed time value stored in the slope compensation minimum closed time latch 768. The minimum closed time value may be loaded into the slope compensation minimum closed time latch 768 from a slope compensation minimum closed time register (not shown). The slope compensation switch control signal 352 may be prevented from opening the switch 108 until the minimum closed timer 766 has timed out. If the minimum closed time value is set to zero then there will be no forced minimum closed time for the slope compensation switch 108. The open delay timer 762 and minimum closed timer 766 may be analog and/or digital circuits as more fully described hereinafter. For example the open delay timer 762 may be a analog or digital delay line, and the minimum closed timer 766 may be a simple analog one-shot monostable or digital counter. It is contemplated and within the scope of this disclosure that many other circuit configuration and combinations may be designed to perform the intended functions described herein by one having ordinary skill in electronic circuit design and having the benefit of this disclosure.

Figure 8:
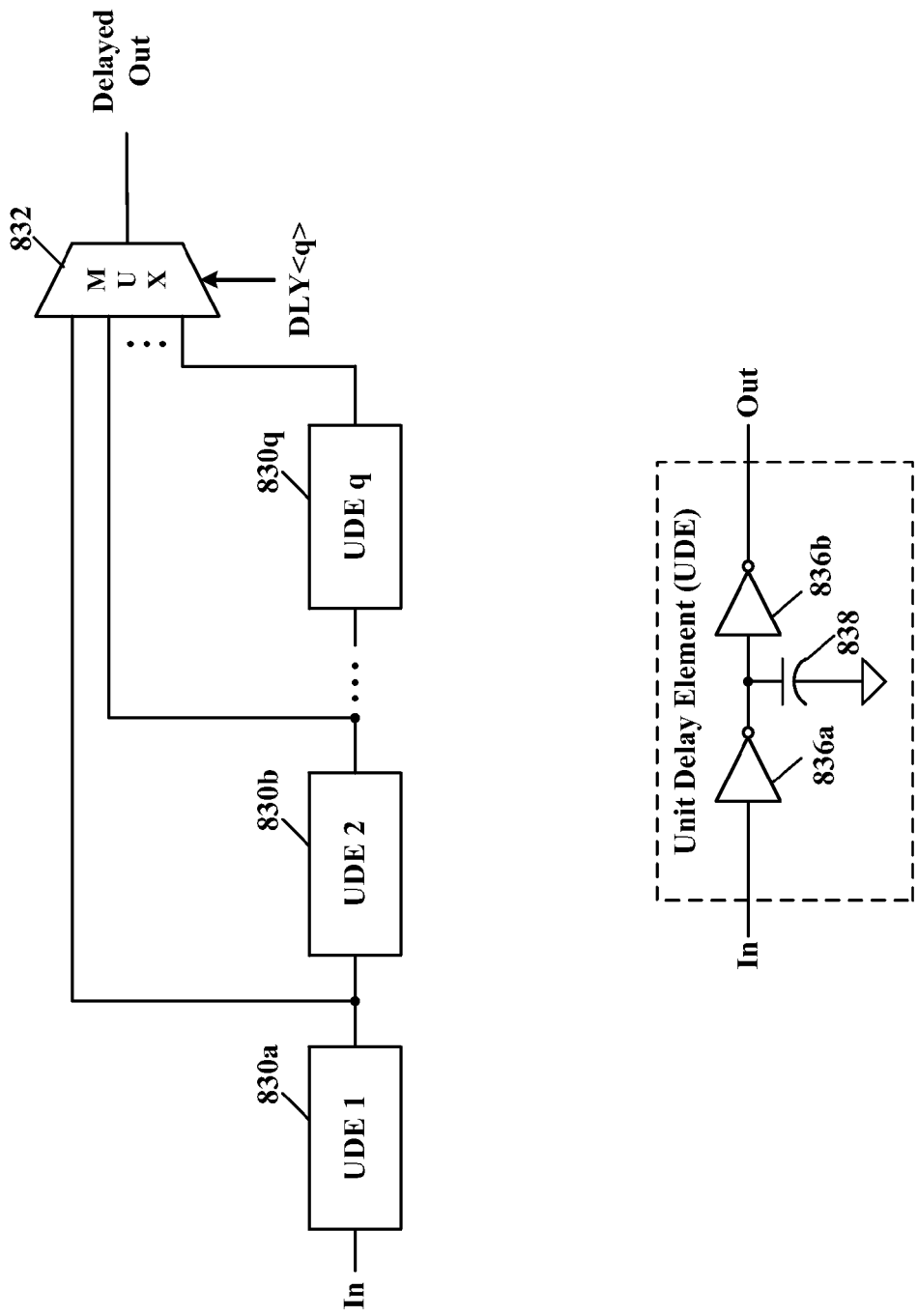
FIG. 8 illustrates a more detailed schematic block diagram of an analog time delay circuit, according to the teachings of this disclosure.

Referring to FIG. 8, depicted is a more detailed schematic block diagram of an analog time delay circuit, according to the teachings of this disclosure. This time delay circuit may comprise a plurality of unit delay elements (UDEs) 830 and a multiplexer 832. A specific time delay may be obtained by selection of the appropriate number of series coupled UDEs 830 with the multiplexer 832 that may be controlled from an input selection address from a non-zero open time delay value in the open delay latch 760. When the output from the multiplexer 832 goes to a logic high the open delay timer 762 output is at a logic high. The minimum closed timer 766 may be for example but is not limited to a monostable one-shot.

Figure 9:
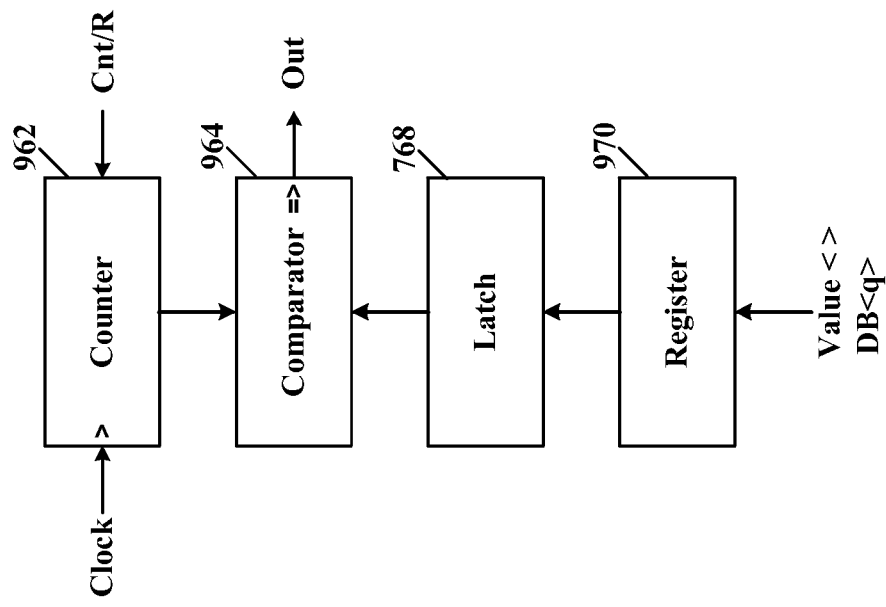
FIG. 9 illustrates a more detailed schematic block diagram of a digital time delay circuit, according to the teachings of this disclosure.

Referring to FIG. 9, depicted is a more detailed schematic block diagram of a digital time delay circuit, according to the teachings of this disclosure. This time delay circuit may comprise a counter 962 that counts each clock pulse and outputs its count value to a comparator 964. The comparator 964 compares the count value to a time value, e.g., minimum closed time value that may be stored in the minimum closed time latch 768. When the count value is equal to or greater than the time value, an output, Out, from the comparator 964 goes to a logic high. Register 970 may be used to asynchronously store the time values for subsequent synchronous transfer to the minimum closed time latch 768.

Referring to FIG. 10, depicted is a schematic block diagram of an analog saw-tooth and pulse width modulation generator using a slope compensation module, according to yet another specific example embodiment of this disclosure. The slope compensation module 101 disclosed herein may be used in combination with first and second voltage comparators 1066 and 1068, respectively, and a digital-to-analog converter (DAC) 1060 to provide an analog (no digital circuits nor clock input required) pulse width modulation (PWM) generator and/or a saw-tooth oscillator. The first voltage comparator 1066, the second voltage comparator 1068 and the DAC 1060 may be coupled to the slope compensation module 101 as shown in FIG. 10. The constant current source 112 may be programmable as more described fully described hereinabove. The voltage reference coupled to the negative input of the first comparator 1066 may be any value voltage. 1.2 volts is shown as this voltage reference for demonstrative purposes only. The buffer amplifier 114 is optional and is only required if the source, e.g., DAC 1060 does not have sufficient output capabilities to drive the capacitor 110 in the slope compensation module 101. FIG. 10A shows an alternative slope compensation module 101a that may be used instead.

Figure 11:
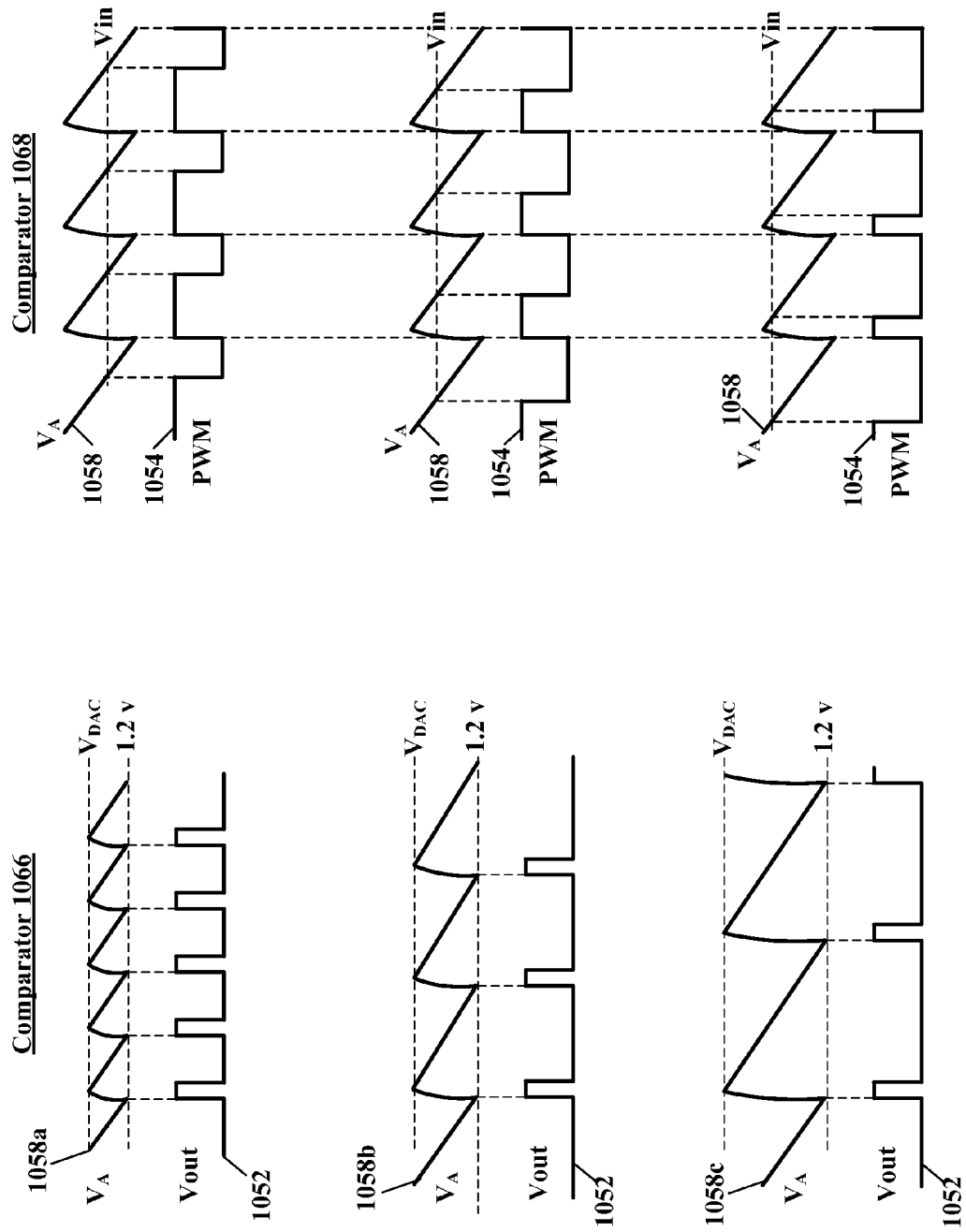
FIG. 11 illustrates schematic waveform timing diagrams of the saw-tooth and pulse width modulation generator, according to the specific example embodiment shown in FIG. 10.

When the output voltage 1058, $V_A$, of the slope compensation module 101 is greater than the reference voltage, e.g., 1.2 volts, the output of the first voltage comparator 1066 will be at a logic high and the switch 108 will be open, thereby allowing the constant current source 112 to discharge the capacitor 110 in a linear voltage ramp (see FIG. 11). This voltage discharge ramp will have a slope proportional to the constant current value divided by the capacitance value. When the output voltage 1058, $V_A$, goes to less than the reference voltage, the output of the first voltage comparator 1066 will switch to a logic low and the switch 108 will close. Once the switch 108 closes, the output voltage 1058, $V_A$, jumps back to the voltage at the input of the slope compensation module 101, e.g., voltage output from the DAC 1060. Thus the output of the first voltage comparator 1066 remains at a logic high for only a very brief time (see FIG. 11). This on and off switching may have a period determined by the voltage difference between the voltage output of the DAC 1060 and the reference voltage at the negative input of the first voltage comparator 1066. The greater the voltage difference, the longer the oscillation period (lower frequency), see FIG. 11. Thus the voltage value from the DAC 1060 may be used to set the pulse period (frequency) as well as changing the value of a programmable capacitor 110.

Figure 13:
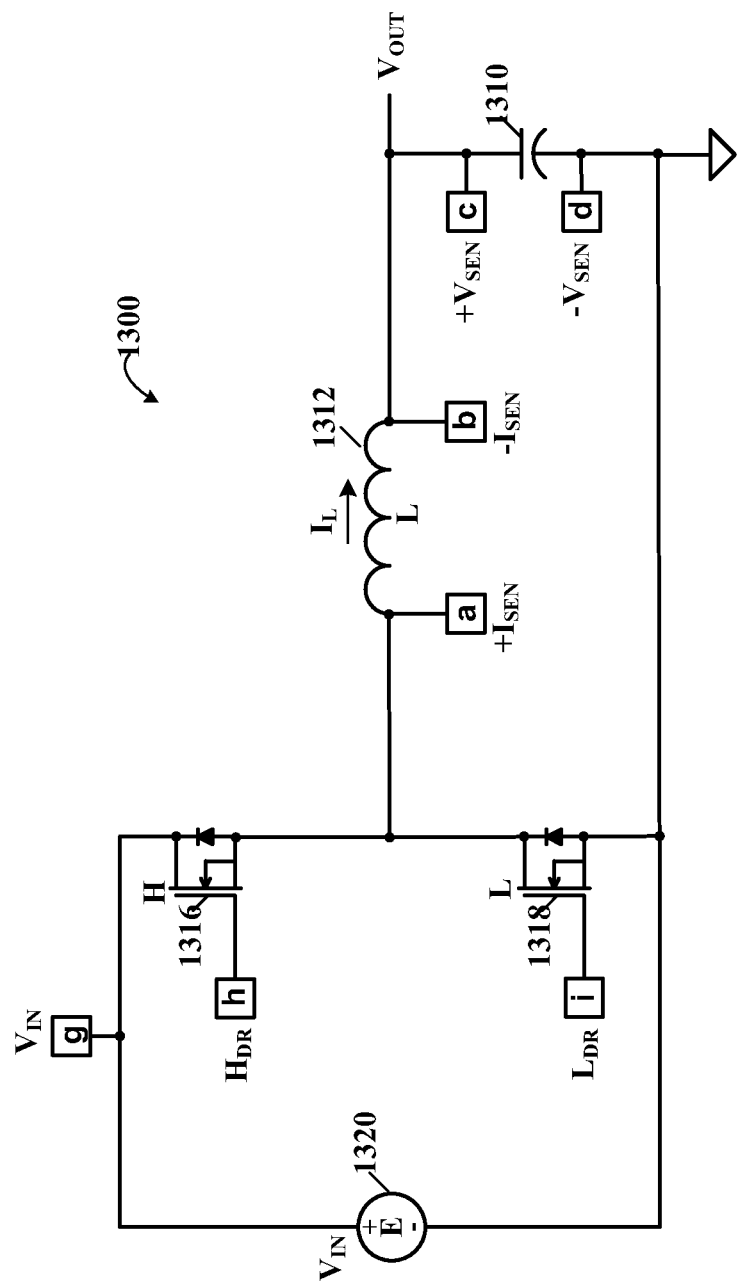
FIG. 13 illustrates a schematic diagram of power components used in a typical switched-mode power supply (SMPS) application.

The second voltage comparator 1068 compares the sawtooth voltage waveform generated as described above and a voltage input, Vin, e.g., an output voltage from a power supply (e.g., $V_{SEN}$ of FIG. 13). Once the pulse period (slope repetition rate) has been set as described above, the second voltage comparator 1068 may be used to generate various pulse widths for a PWM output 1054. Thus the DAC 1060, the slope compensation module 101 and the first comparator 1066 may determine the PWM period (frequency). The slope compensation module 101 and the second comparator 1068 may determine the PWM duty cycle (pulse width) that will vary with changes in an input voltage, Vin.

Referring to FIG. 10A, depicted is a schematic diagram of a slope compensation module that may be alternatively used in all of the embodiments of this disclosure. The buffer amplifier 114 shown in FIGS. 1, 3 and 10 may be completely eliminated by disconnecting the constant current source 112 from the slope compensation capacitor 110 when the switch 108a is in its normally closed position and discharging the capacitor 110. A single pole double throw (SPDT) switch may be used for the switch 108a or two single pole single throw (SPST) switches used, one normally closed and the other normally open. Switch 108a may be a solid state switch (es), e.g., metal oxide semiconductor field effect transistor (MOSFET).

FIG. 11, depicted are schematic waveform timing diagrams of the saw-tooth and pulse width modulation generator, according to the specific example embodiment shown in FIG. 10. Referring to the waveforms for the first comparator 1066, as the voltage difference between the DAC 1060 output voltage and the reference voltage (e.g., 1.2 volts) increases, the oscillation waveforms (saw-tooth and pulse) time period increases (frequency decreases). Referring to the waveforms for the second comparator 1068, as the input voltage, Vin, increases in relation to the output voltage, $V_A$, from the slope compensation module 101, the pulse width or duty cycle of the PWM signal (output 1054 from the second comparator 1068) decreases. This is advantageous for control of a switched-mode power supply as the PWM pulse width is inversely proportional to the value of the error voltage caused by changes in the SMPS output voltage.

Figure 12:
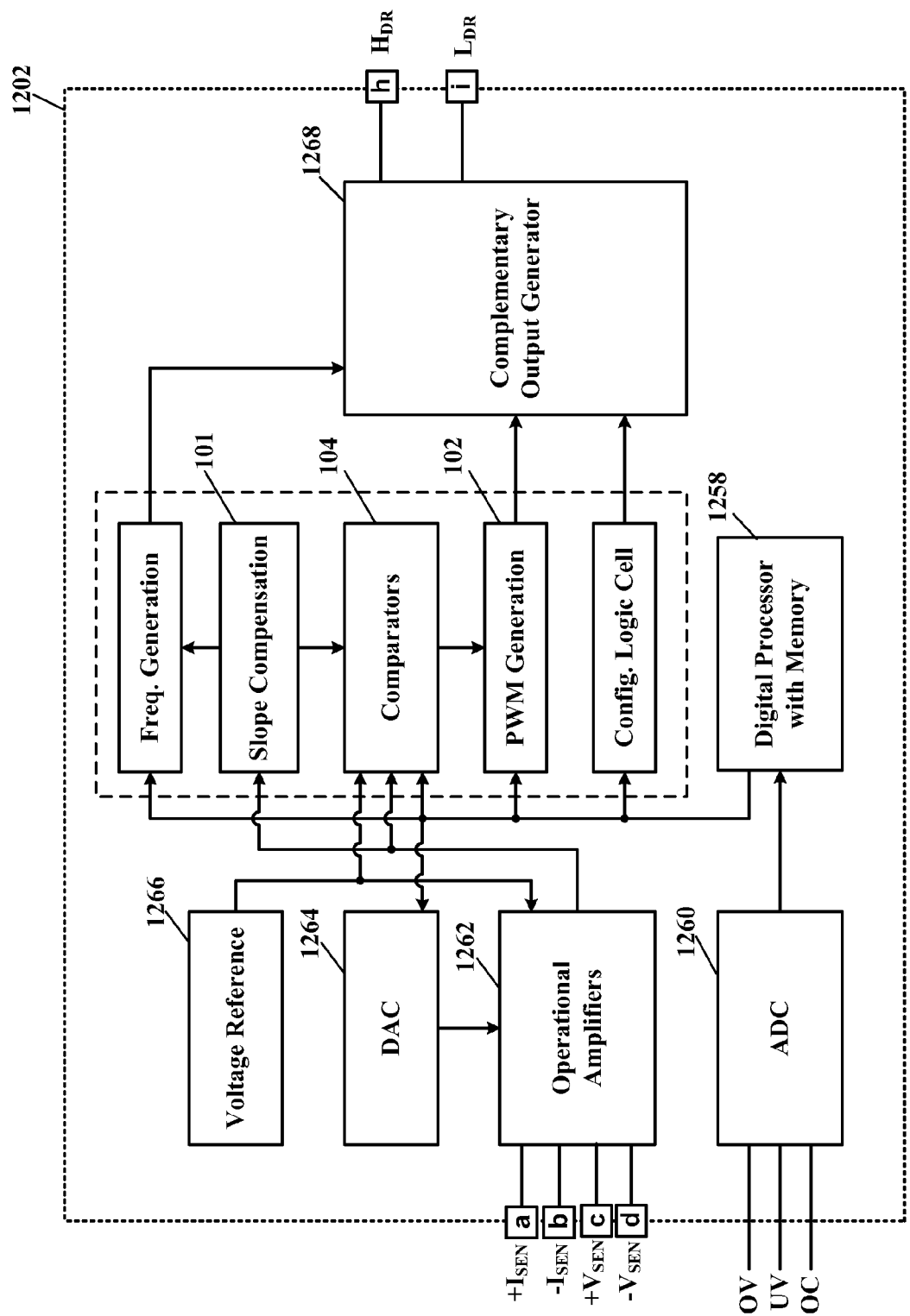
FIG. 12 illustrates a schematic block diagram of a mixed signal integrated circuit device having a pulse width modulation generator with slope compensation, according to the teachings of this disclosure.

Referring to FIG. 12, depicted is a schematic block diagram of a mixed signal integrated circuit device having a pulse width modulation generator with slope compensation, according to the teachings of this disclosure. A mixed signal integrated circuit device 1202 that may be used for controlling a switched-mode power supply (SMPS), etc. The mixed signal integrated circuit device 1202 may comprise one or more of the following: a complementary output generator 1268, a pulse width modulation (PWM) generator with slope compensation (see FIGS. 1 and 3); a digital processor with memory 1258, analog-to-digital converter(s) ADC 1260, operational amplifiers 1262, digital-to-analog converter(s) (DAC) 1264, and a voltage reference(s) 1266.

Referring to FIG. 13, depicted is a schematic diagram of power components used in a typical switched-mode power supply (SMPS) application. The power components of the SMPS 1300 are fed from a voltage source 1320, Vin, and may comprise a high transistor 1316, a low transistor 1318, an inductor 1312 and a filter capacitor 1310, all coupled to the mixed signal integrated circuit device 1202 shown in FIG. 12.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A slope compensation module for use with current mode control in a switched-mode power supply (SMPS) controller,
    said SMPS controller comprising:
        an error amplifier comprising an output; and
        a voltage comparator comprising a first input;
    said slope compensation module comprises:
        a slope compensation capacitor coupled between the output of the error amplifier and the first input of the voltage comparator;
        a slope compensation switch coupled in parallel with the slope compensation capacitor; and
        a programmable constant current source coupled to the an output side of the slope compensation capacitor and to the slope compensation switch;
        wherein when the slope compensation switch is open the slope compensation capacitor charges through the programmable constant current source to a circuit common and thereby generates a linearly decreasing (negative slope) ramp voltage.

2. The slope compensation module according to claim 1, wherein when the slope compensation switch is closed the slope compensation capacitor discharges.

3. The slope compensation module according to claim 1, wherein the slope compensation switch is a single pole double throw switch and the programmable constant current source is decoupled from the output side of the slope compensation capacitor when the slope compensation switch is in a first position, and coupled to the output side of the slope compensation capacitor when the slope compensation switch is in a second position.

4. The slope compensation module according to claim 1, wherein the linearly decreasing ramp voltage is adapted to automatically adjust a feedback loop error voltage.

5. The slope compensation module according to claim 1, wherein the programmable constant current source is formed by a constant current digital-to-analog converter (IDAC) coupled with an IDAC register.

6. The slope compensation module according to claim 1, wherein the slope compensation capacitor comprises a plurality of slope compensation capacitors programmably selectable for a desired capacitance value.

7. A switched-mode power supply (SMPS) controller having a slope compensation module, comprising:
    a voltage reference;
    an error amplifier coupled with the voltage reference and comprising an output; and
    a voltage comparator comprising a first input;
    a slope compensation module having an input coupled to an output of the error amplifier, and an output, wherein the slope compensation module comprises:
    a slope compensation capacitor coupled between the output of the error amplifier and the first input of the voltage comparator;
    a slope compensation switch coupled in parallel with the slope compensation capacitor; and
    a programmable constant current source coupled to an output side of the slope compensation capacitor;
    wherein a second input of the voltage comparator is adapted for coupling to a current-to-voltage circuit that measures a current signal;
    a period generator; and
    a reset dominant latch comprising
    a set input coupled to an output of the period generator,
    a reset input coupled to an output of the voltage comparator, and
    an output that is coupled to and controls opening and closing the slope compensation switch,
    the output of the reset dominant latch also provides a control signal;
    the period generator provides a plurality of pulses at a pulse period to the set input of the reset dominant latch, wherein each time a pulse is received at the set input of the reset dominant latch the output thereof goes to a second logic level from a first logic level;
    when the output of the reset dominant latch is at the second logic level the slope compensation switch opens and the slope compensation capacitor charges through the programmable constant current source to a circuit common, thereby generating a linearly decreasing ramp voltage for modulating a feedback error voltage from the error amplifier into a slope compensated feedback error voltage;
    when the slope compensated feedback error voltage that is coupled to the first input of the voltage comparator is less than a voltage representing the current through the SMPS inductor at the second input of the voltage comparator, the output of the reset dominant latch returns to the first logic level and the slope compensation switch closes thereby discharging the slope compensation capacitor and returning the first input of the voltage comparator to the feedback error voltage from the error amplifier.

8. The slope compensation module according to claim 7, further comprising a buffer amplifier coupled between the output of the error amplifier and the slope compensation capacitor.

9. The SMPS controller according to claim 7, further comprising a buffer amplifier coupled between the output of the error amplifier and the slope compensation capacitor and switch.

10. The SMPS controller according to claim 7, further comprising a loop compensation network coupled between the output and the second input of the error amplifier.

11. The SMPS controller according to claim 7, wherein the voltage representing the current through the SMPS inductor is generated with a current-to-voltage sensor.

12. The SMPS controller according to claim 11, wherein the current-to-voltage sensor comprises a current transformer in a current path of the SMPS inductor, a rectifier diode coupled to the current transformer and a load resistor coupled to the resistor.

13. The SMPS controller according to claim 11, wherein the current-to-voltage sensor comprises a resistor in a current path of the SMPS inductor and a diode coupled to the resistor.

14. The SMPS controller according to claim 7, wherein the period generator is programmable for selecting one of a plurality pulse period times.

15. The SMPS controller according to claim 7, wherein the slope compensation switch is a metal oxide semiconductor field effect transistor (MOSFET).

16. The SMPS controller according to claim 7, further comprising a slope compensation switch controller coupled between the output of the reset dominant latch and the slope compensation switch, wherein the slope compensation switch controller provides programmable opening delay for the slope compensation switch.

17. The SMPS controller according to claim 16, further comprising the slope compensation switch controller providing programmable minimum closed time for the slope compensation switch.

18. The SMPS controller according to claim 7, wherein the output voltage from the SMPS filter capacitor is provided through a resistive voltage divider.

19. The SMPS controller according to claim 7, wherein the programmable constant current source is adapted for calibration during testing of the SMPS controller.

20. The SMPS controller according to claim 7, wherein the slope compensation capacitor is a plurality of slope compensation capacitors programmably selectable for a desired capacitance value.

21. The SMPS controller according to claim 7, wherein the slope compensation capacitor is a plurality of slope compensation capacitors programmably selectable for a desired capacitance value during testing of the SMPS controller.

22. The SMPS controller according to claim 7, further comprising a digital processor coupled to the programmable constant current source and to the period generator that is programmable, wherein the digital processor provides constant current values and pulse period times, respectively, thereto.

23. The SMPS controller according to claim 7, wherein the SMPS controller is embedded in a microcontroller.

24. The SMPS controller according to claim 7, wherein the programmable constant current source is coupled to the output side of the slope compensation capacitor with the slope compensation switch.

25. The SMPS controller according to claim 7, wherein the programmable constant current source is decoupled from the output side of the slope compensation capacitor when the slope compensation switch is in a first position, and coupled to the output side of the slope compensation capacitor when the slope compensation switch is in a second position.

26. An analog pulse width modulation (PWM) generator, comprising:
   a capacitor having an input coupled to a first voltage reference;
   a switch coupled in parallel with the input and an output of the capacitor;
   a programmable constant current source coupled to the output of the capacitor;
   a first voltage comparator having a first input coupled to the output of the capacitor, a second input coupled to a second voltage reference and an output that controls opening and closing of the switch;
   a second voltage comparator having a first input coupled to the output of the capacitor, a second input adapted for coupling to a voltage from a switched-mode power supply (SMPS) and an output that provides a pulse width modulated (PWM) control signal for controlling a power switch of a switched-mode power supply;
   wherein when a voltage at the output of the capacitor is less than a voltage from the first voltage reference the switch will open, whereby the capacitor and the programmable constant current source modulate a voltage from the first voltage reference with a linear negatively sloping voltage waveform;
   wherein a voltage difference between the first and second voltage references determines a period of the PWM control signal, and a voltage difference between the voltage from the SMPS and the voltage at the second node of the capacitor determines a duty cycle of the PWM control signal.

27. The analog PWM generator according to claim 26, wherein the programmable constant current source is firmed by a constant current digital-to-analog converter (IDAC) coupled with an IDAC register.

28. The analog PWM generator according to claim 26, wherein the capacitor is a plurality of capacitors programmably selectable for a desired capacitance value.

29. The analog PWM generator according to claim 26, wherein the first voltage reference is a digital-to-analog converter (DAC) and provides programmable first reference voltage values.

30. The analog PWM generator according to claim 26, wherein the first voltage reference is fixed.

31. The analog PWM generator according to claim 26, wherein the first voltage reference is a modulated waveform signal.

32. The analog PWM generator according to claim 26, further comprising a buffer amplifier coupled between the output of the first voltage reference and the input of the capacitor.

33. The analog PWM generator according to claim 26, wherein the programmable constant current source is decoupled from the output of the capacitor when the switch is in a first position, and coupled to the output of the capacitor when the switch is in a second position.

34. A method for providing slope compensation in a switched-mode power supply (SMPS) controller comprising an error amplifier with an output, a voltage comparator with a first input, a slope compensation capacitor coupled between the output of the error amplifier and the first input of the voltage comparator, a slope compensation switched coupled in parallel with the slope compensation capacitor, and a programmable constant current source coupled to an output side of the slope compensation capacitor and to the slope compensation switch, said method comprising the steps of:
   providing a reference voltage;
   comparing the reference voltage to output feedback voltage from the SMPS controller with the error amplifier that provides an error voltage that is the difference between the reference voltage and the voltage from the SMPS filter network;
   comparing a slope compensated error voltage from the slope compensation capacitor to a voltage representation of current measured in a SMPS inductor;
   providing a reset dominant latch having a set input coupled to an output of a period generator, a reset input coupled to an output of the voltage comparator, and an output that controls opening and closing of the slope compensation switch and for supplying a control signal; and
   providing a plurality of pulses at a pulse period from the period generator to the set input of the reset dominant latch, wherein each time a pulse is received at the set input of the reset dominant latch the output thereof goes to a second logic level from a first logic level;
   opening the slope compensation switch when the output of the reset dominant latch is at the second logic level;
   generating a linearly decreasing ramp voltage for modulating the feedback error voltage from the error amplifier into a slope compensated feedback error voltage; and
   returning the output of the reset dominant latch to the first logic level and closing the slope compensation switch when the slope compensated error voltage is less than the voltage representing the current through the SMPS inductor.

* * * * *